United States Patent
Kaneko et al.

(10) Patent No.: US 6,777,376 B1
(45) Date of Patent: Aug. 17, 2004

(54) SUPERCONDUCTING WIRE

(75) Inventors: Tetsuyuki Kaneko, Osaka (JP); Munetsugu Ueyama, Osaka (JP); Akira Mikumo, Osaka (JP); Naoki Ayai, Osaka (JP); Shin-ichi Kobayasi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 312 days.

(21) Appl. No.: 09/684,336

(22) Filed: Oct. 10, 2000

(30) Foreign Application Priority Data

Dec. 28, 1999 (JP) .......................................... 11-373239

(51) Int. Cl.[7] .............................................. H01B 12/00
(52) U.S. Cl. .................... 505/238; 174/125.1; 505/230; 505/237
(58) Field of Search ..................... 174/125.1; 505/230, 505/231, 232, 704, 886, 887, 233, 237, 234, 235, 236, 884

(56) References Cited

U.S. PATENT DOCUMENTS 4,171,464 A * 10/1979 Steyert, Jr. ............... 174/125.1
5,849,670 A * 12/1998 Nabatame et al. .......... 505/230

FOREIGN PATENT DOCUMENTS

| JP | 1-134809 A | 5/1989 |
| JP | 1-161623 | 6/1989 |
| JP | 4-94014 A | 3/1992 |

OTHER PUBLICATIONS

Y. hikichi et al., "Development of Ag–Mg–α Alloy Sheathed Bi2223 Multifilament Tapes", Advances in Superconductivity XI, Nov. 16–19, 1998, Fukuoka, pp. 915–918, Springer–Verlag.

* cited by examiner

Primary Examiner—Kamand Cuneo
Assistant Examiner—I. B Patel
(74) Attorney, Agent, or Firm—Foley & Lardner LLP

(57) ABSTRACT

In order to provide a superconducting wire that has a high critical current value, has no defects such as bulges, and has high mechanical strength, an oxide superconducting material (1) is covered, and ceramic particles or fibers (3) are buried in the surface of a covering (2) made of metal

7 Claims, 2 Drawing Sheets

SUPERCONDUCTING WIRE

BACKGROUND OF THE INVENTION

1. Field of the Invention

This invention relates to a superconducting wire and a manufacturing method thereof.

2. Description of the Related Art

When manufacturing a superconducting wire in which a copper oxide superconducting material is covered with a metal, a single core is generally made by filling oxide powders in a metallic pipe of, for example, silver. The single cores are bundled together, and are inserted into another metallic pipe of, for example, silver, thereby obtaining a multi-core structure. A bus having the multi-core structure undergoes wire drawing or rolling so as to become wire-shaped, and then undergoes heat treatment. As a result, a wire provided with superconductivity can be obtained. In the superconducting wire manufactured in this manner, there are three important points required for its practical use as follows:

(1) Superconducting wire has a high critical current value;
(2) Superconducting wire does not have the defect of, for example, bulging; and
(3) Superconducting wire does not undergo a decrease in the critical current value (with increased mechanical strength) when various external forces are applied thereto.

Concerning the first point (1), the critical current value depends greatly on how powder portions having superconductivity are transformed (reacted) to a desired superconducting phase with high purity. Since a superconductor is an oxide, a chemical exchange is inevitably carried out between the oxide and outside gas (especially, oxygen) in the reaction. Accordingly, in order to obtain a high purity superconducting phase, it is important to cause gas (especially, oxygen) to move in and out smoothly (almost naturally).

Concerning the second point (2), bulging, which is associated with the reaction of the oxide, occurs such that oxygen gas emitted from the powders during the reaction accumulates in the wire and expands due to heat treatment, thus bulging the wire.

In order to achieve points (1) and (2), a metal-covered oxide superconducting wire uses silver as a covering material. Silver is high in oxygen permeability and allows oxygen to flow in and out smoothly between the inside of the wire and the outside atmosphere. In addition, there has been employed a method of decreasing the thickness of a silver covering or forcibly boring holes through the silver covering so as to facilitate the in and out movement of oxygen. This method of boring holes therethrough, is disclosed by, for example, Japanese Laid-open Patent Publication No. Hei-1-161623.

Concerning the third point (3), when using silver as a covering material, a method of adding second and third metals to the silver has been generally employed to improve the strength of a covering because pure silver is weak in mechanical strength. In other words, in a case where silver to which second and third metals have been added is used as a starting material (called covering tube or alloy tube), such additives are oxidized during heat treatment such that they are dispersed as oxides in the covering. As a result, the strength of the covering is improved This method is disclosed in, for example, Y.Hikichi et al., "Development of Ag—Mg—α Alloy Sheathed Bi2223 Multifilament Tapes", Advances in Superconductivity XI, Nov. 16–19, 1998, Fukuoka, pp.915–918.

However, it is difficult for conventional techniques to satisfy the three points (1), (2), and (3) simultaneously. The reason is that the method of thinning the covering or forcibly boring holes for achieving the points (1) and (2) lowers the mechanical strength of the covering. The mechanical strength of the covering increases with the increase of the volume of the covering, but the strength thereof decreases because the volume of the covering decreases because of thinning the covering. Further, if holes are locally bored through the covering, the local strength of the covering is greatly lowered, and as a result, the average strength thereof decreases.

On the other hand, the method employing a silver-covered tube to which the second metal is added to heighten the strength thereof has the following drawback.

An oxide superconductor, especially a bismuth-based superconductor is seldom reactive to silver, and is easily and smoothly shifted to a desired superconductive phase when it is in contact with silver. However, it is easily reactive to elements (components) other than silver, and, accordingly, it causes a compositional disarrangement of the powder portion and cannot obtain the desired high purity superconductive phase. Thus, the critical current of a wire using the alloy tube was lower than that of a wire using a pure silver tube.

SUMMARY OF THE INVENTION

It is therefore an object of the present invention to provide a superconducting wire that has a high critical current value and no defects of bulging for example, and, additionally, has a high mechanical strength, and to provide a manufacturing method thereof.

A superconducting wire according to the present invention comprises an oxide superconducting material; a metallic covering material made of metal, for covering a surface of the oxide superconducting material; and ceramic materials buried in a surface of the metallic covering material.

In the superconducting wire of the present invention, ceramic materials are buried in a metallic covering from the outer surface of the covering, and thereby the outer layer of a part of the covering where the ceramic materials have been buried thins partially. In addition to this, the contact interface between the buried ceramic materials and the metallic covering serves as a passage through which gas easily flows in and out. This provides the same effect as the conventional technique of thinning. Accordingly, a powder portion having superconductivity can be changed to a superconductive phase with high purity, and, additionally, defects such as bulges can be reduced.

Concerning the thinning, ceramic materials are structurally dispersed into the metallic covering, thus improving the mechanical strength advantageously.

Since the ceramic materials are buried from outside in the outer surface of the metallic covering, the contact probability between the ceramic materials and the superconducting powder portion is small, and the powder portion does not facilitate the disarrangement of its composition. Accordingly, a high purity superconductive phase can be obtained.

These make it possible to obtain a superconducting wire that has a high critical current value, no defects such as bulges, and a high mechanical strength.

Preferably, ceramic materials in the superconducting wire are in a form of at least particles or fibers.

Thus, in the form of particles or fibers, gas can easily flow in and out, and the mechanical strength is heightened.

Preferably, the ceramic materials in the superconducting wire, are oxides. Accordingly, it is possible to perform a method in which the surface of the metallic covering is plated with metal elements of the ceramic materials and, in a subsequent heat treatment process, the metal elements are changing to oxides as ceramic materials.

More preferably, the ceramic materials in the superconducting wire comprise one or more kinds of materials selected from the group consisting of alumina, magnesia, and zirconia. Accordingly, particularly high critical current values can be obtained, and a material suitable for the ceramic material can be selected as necessary.

Preferably, the oxide superconducting material of the superconducting wire comprises a bismuth-based superconductor.

Thus, the bismuth-based oxide superconductor is suitable for the structure of the present invention.

The material of the metallic covering material of the superconducting wire mainly comprises silver. This enables oxygen to flow in and out smoothly when the oxide superconducting material is changed to a superconductive phase with high purity, and the reaction between the metallic covering and the oxide superconducting material can be prevented.

In a method of manufacturing a superconducting wire of the present invention, heat treatment is conducted under a state in which a surface of a member including at least a superconductive phase is covered, and ceramic materials are buried in a surface of a metallic covering material.

Accordingly, the superconducting wire manufacturing method of the present invention enables the manufacture of a superconducting wire having a high critical current value, no defects such as bulges, and a high mechanical strength. Further, since the ceramic materials do not react easily with an oxide superconductor, the oxide superconducting material can be shifted smoothly to a superconductive phase of an oxide superconducting material even when heat treatment is conducted while the ceramic materials are buried in the surface of the metallic covering.

Preferably, in the manufacturing method, the process of burying the ceramic materials in the metallic covering material comprises a step of mechanically pressing the ceramic materials and the metallic covering material while the ceramic materials are dredged over the surface of the metallic covering material.

Accordingly, the ceramic materials can be buried in the metallic covering material.

Preferably, the step of mechanically pressing method comprises one or more methods selected from extruding, drawing, rolling, and pressing.

Accordingly, the step of mechanical pressing the ceramic material to bury it in the metallic covering material can be selected appropriately.

Preferably, in the manufacturing method, the process of burying the ceramic material in the metallic covering comprises a step of conducting heat treatment while ceramic materials contact the surface of the metallic covering material.

Accordingly, it is possible to perform a method of plating the surface of the metallic covering with metal elements (for example, Aluminum, Magnesium, and Zirconium) of the ceramic materials and, in a subsequent heat treatment process, changing the metal elements to oxide ceramic materials.

DETAILED DESCRIPTION OF THE PREFERRED EMBODIMENT

An embodiment of the present invention will hereinafter be described with reference to the attached drawings.

Figure 1:
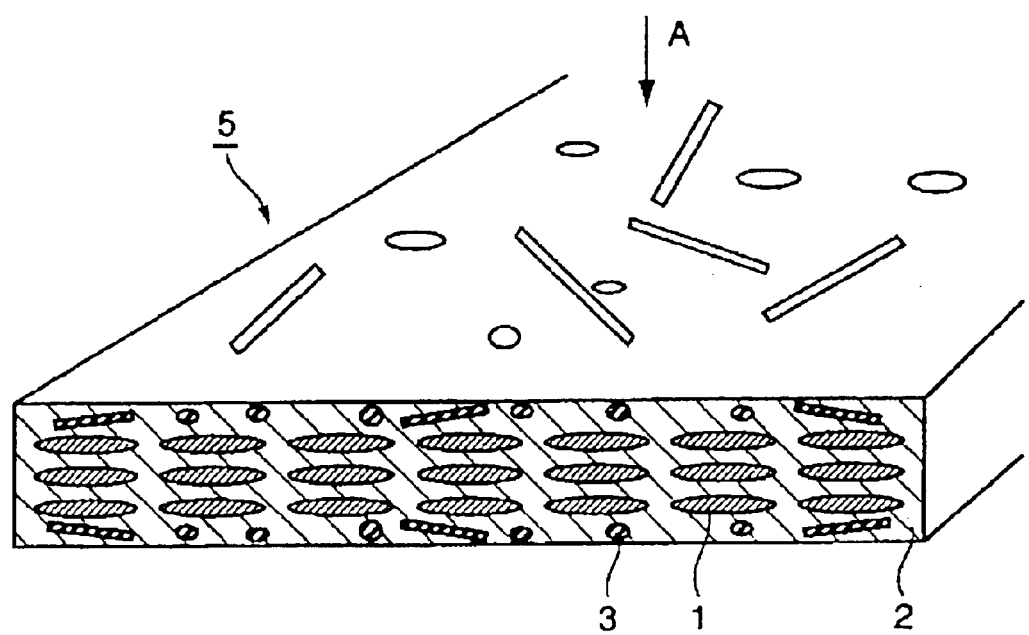
FIG. 1 is a partially sectional perspective view schematically showing a structure of an oxide superconducting wire according to an embodiment of the present invention.
Figure 2:
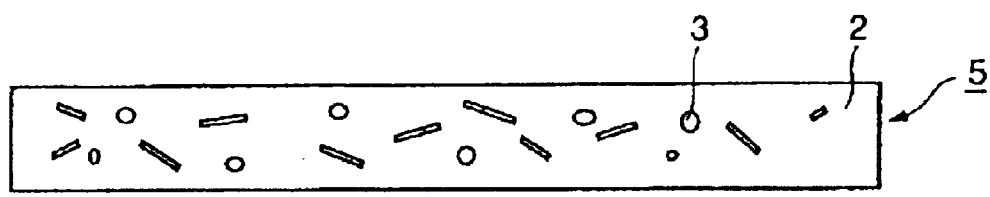
FIG. 2 is a view from the direction of arrow A of FIG. 1.

FIG. 1 is a partially sectional perspective view schematically showing a structure of an oxide superconducting wire, and FIG. 2 is a view from the direction of arrow A of FIG. 1.

Referring to FIGS. 1 and 2, the superconducting wire 5 comprises oxide superconducting materials 1, a metallic covering material 2 that covers the surface of the oxide superconducting material 1 and is made of metal, and ceramic particles or fibers 3 buried in the surface of the covering material 2.

Preferably, the oxide superconducting material 1 is made of, for example, a Bismuth-based superconductor, and the covering material 2 is made of, for example, material composed chiefly of silver. The ceramic particle or fiber 3 is preferably an oxide. More specifically, the ceramic particle or fiber 3 is preferably made of one or more kinds of materials selected from the group consisting of Alumina, Magnesia, and Zirconia.

Figure 3:
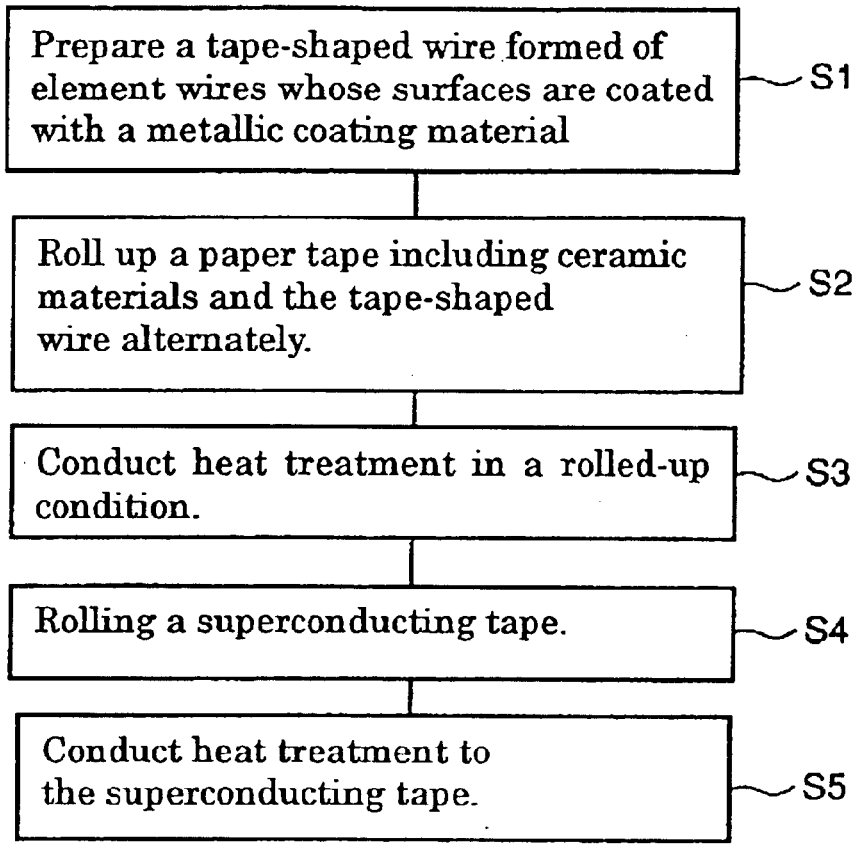
FIG. 3 shows a method of manufacturing the oxide superconducting wire according to the embodiment of the present invention.

Next, a description of a method of manufacturing the oxide superconducting wire as constructed above will be provided. FIG. 3 shows the method of manufacturing the oxide superconducting wire according to the embodiment of the present invention. Referring to FIG. 3, oxide or carbonate raw powders were mixed to have bad the composition ratio of Bi:Pb:Sr:Ca:Cu=1.8:0.3:1.9:2.0:3.0. Heat treatment at about 700–860° C. was applied to the powders several times, and then the powders were reacted with a powder which had a considerable amount of $(BiPb)_2Sr_2Ca_1Cu_2O_z$ (called Bi-2212 phase), a small amount of $(BiPb)_2Sr_2Ca_2Cu_3O_z$ (called Bi-2223 phase), and a non-superconductive phase. Thereafter, deaerating processing was conducted, and then the powder was filled into a silver pipe. The temperature of the deaerating processing was set on condition that the aforementioned structural phase of the powder was not changed.

The silver pipe (element wire of a single core) filled with this powder was subjected to diameter reduction processing by wire drawing. The reduced element wire was then cut to obtain 61 element wires for engagement. Thereafter, the 61 element wires were inserted into another silver pipe, thereby forming a multi-core structure having 61 cores.

The multi-core base material was then subjected to deaerating processing, then to vacuum drawing to produce a high vacuum therein, and was capped by electron beam welding, thus maintaining the vacuum therein.

Figure 4:
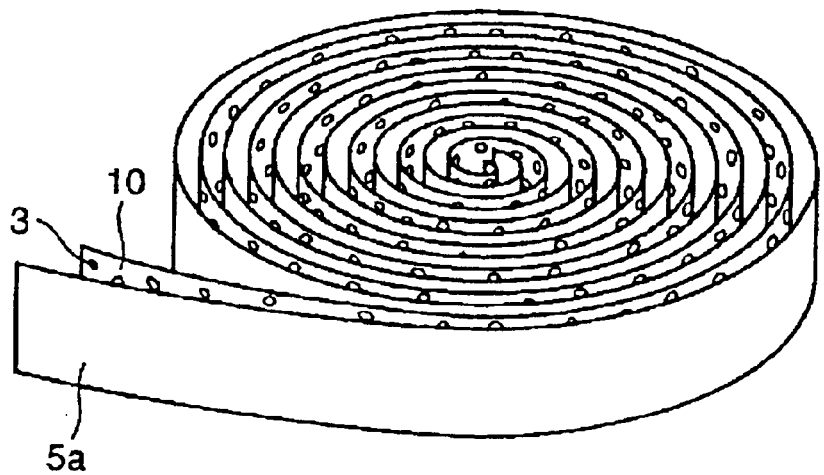
FIG. 4 is a perspective view showing a state in which a ceramic containing a paper tape and a superconducting tape are rolled up alternately.

The sealed up multi-core structural base material was subjected to wire drawing to create an elongated material, and was subjected to rolling processing to obtain a tape-shaped wire (step S1). A paper tape 10 that includes ceramic particles or fibers 3, as shown in FIG. 4, and the multi-core structural tape 5a were alternately rolled up like a pancake. It was then placed on a board (step S2). Thereafter, it was subjected to heat treatment together with the board for more than 50 hours at about 850° C. in the atmosphere (step S3).

At this stage, the ceramic particles or fibers 3 included in the paper tape 10 adhered to the silver covering of the tape 5a, and part of the ceramic particles or fibers 3 was buried. The superconducting tape 5a was again subjected to rolling processing (step S4). As a result, the adhering ceramic particles or fibers 3 were buried more firmly in the silver covering. Thereafter, in order to conduct heat treatment again, the superconducting tape 5a was rolled up together with the paper tape 10 that included the ceramic particles or fibers 3, as in FIG. 4, and was subjected to heat treatment for more than 50 hours at about 850° C. in the atmosphere (step S5).

The thus formed superconducting wire had the structure shown in FIGS. 1 and 2. The superconducting wire was 4 mm in width, 02 mm in thickness, and 0.25 $mm^2$ in the area of a superconducting portion of a section i.e., total area of filament).

Concerning the buried ceramic oxide superconducting wire manufactured according to the aforementioned steps and an oxide superconducting wire manufactured so as not to bury the ceramic materials, an examination was made of critical current values, number of bulges, and stress (mechanical strength). Table 1 shows the results. The critical current value was measured at a liquid nitrogen temperature. The number of bulges is that of bulges per km. The mechanical strength was evaluated by a tensile stress whereby a critical current value has a value of 90% in comparison with an initial critical current value (state of applying no force) while applying a drawbar pull at room temperature.

TABLE 1

|  | Example of Present Invention Ceramic-Buried | Comparative Example Not Buried |
| --- | --- | --- |
| Critical Current Value | 70A | 40A |
| Number of Bulges | 12 | 130 |
| Stress | 100 MPa | 75 Mpa |

Table 1 shows that the oxide superconducting wire in which ceramic particles are buried is superior under each respective critical current value, number of bulges, and mechanical strength (stress).

Next, an examination was made of changes in critical current values according to ceramic materials to be buried in the oxide superconducting wire.

Table 2 shows the result.

TABLE 2

| Ceramic Materials | Alumina | Magnesia | Zirconia | Alumina + Magnesia | Alumina + Zirconia | Magnesia + Zirconia |
| --- | --- | --- | --- | --- | --- | --- |
| Critical Current Value (A) | 60 | 58 | 70 | 63 | 75 | 65 |
| Ceramic Materials | SiC | $LaB_6$ | $Fe_2O_3$ | BN | $SiO_2$ | $WO_3$ |
| Critical Current Value (A) | 45 | 43 | 52 | 46 | 45 | 43 |

Table 2 shows that every ceramic material has a higher critical current value than the oxide superconducting wire of Table 1 in which ceramic particles are not buried. Additionally, Table 2 shows that particularly high critical current values can be obtained in the ceramic materials of Alumina, Magnesia, and Zirconia.

In this embodiment, for burying ceramic particles or fibers into the silver covering, the method of mechanically pressing (for example, rolling) while the ceramic particles or fibers were dredged on a silver covering was employed. However, the present invention is not limited to this method. For example, in case of round-shaped wires, after dredging the ceramic particles or fibers onto the surface of the round wires, the ceramic particles or fibers can be buried with wire drawing or extruding for mechanically pressing, instead of rolling processing. The ceramic particles or fibers will be buried in a metallic covering also during this operation because a force perpendicular to the surface of the metallic covering is applied. Another method of pressing other than rolling, drawing, or extruding can be used.

There is also a method of burying ceramic particles or fibers in a silver covering such that the silver covering is plated with metallic elements (for example, aluminum, magnesium, or zirconium) of the ceramic particles or fibers, and the metallic elements are changed to oxide ceramics during subsequent heat treatment.

It is noted that the embodiment disclosed herein is to be exemplified not to be limited in all respects. The scope of the present invention is indicated not by the description provided above but by the appended claims, and all modifications within the scope of the claims and the doctrine of equivalents are included therein.

What is claimed is:

1. A superconducting wire comprising:

an oxide superconducting material;

a metallic covering material made of metal, for covering a surface of said oxide superconducting material; and ceramic materials buried substantially only in an outer surface of said metallic covering material and substantially not in a core of said metallic covering material wherein, the metallic covering material is directly in contact with the oxide superconducting material.

2. The superconducting wire of claim 1, wherein the form of said ceramic materials comprises at least particles or fibers.

3. The superconducting wire of claim 1, wherein the ceramic materials are oxides.

4. The superconducting wire of claim 3, wherein said ceramic materials comprise one or more kinds of materials selected from the group consisting of alumina, magnesia, and zirconia.

5. The superconducting wire of claim 1, wherein the material of said oxide superconducting material comprises a bismuth-based superconductor.

6. The superconducting wire of claim 1, wherein the material of said metallic covering material comprises silver.

7. The superconducting wire of claim 1, wherein the metallic covering material entirely covers outer surfaces of the ceramic materials buried therein.

* * * * *